United States Patent [19]

Haddon et al.

[11] Patent Number: 5,698,497
[45] Date of Patent: *Dec. 16, 1997

[54] SUPERCONDUCTIVITY IN CARBONACEOUS COMPOUNDS AND DEVICES USING SUCH COMPOUNDS

[75] Inventors: Robert Cort Haddon, Dover; Arthur Foster Hebard, Bernardsville; Donald Winslow Murphy, Green Brook; Matthew Jonathan Rosseinsky, Piscataway, all of N.J.

[73] Assignee: Lucent Technologies Inc., Murray Hill, N.J.

[*] Notice: The term of this patent shall not extend beyond the expiration date of Pat. No. 5,391,323.

[21] Appl. No.: 258,900

[22] Filed: Jun. 13, 1994

Related U.S. Application Data

[63] Continuation of Ser. No. 818,647, Jan. 6, 1992, abandoned, which is a continuation-in-part of Ser. No. 671,275, Mar. 18, 1991, abandoned.

[51] Int. Cl.$^6$ .................... H01L 39/12; H01L 39/24; H01B 12/02; C01B 31/00
[52] U.S. Cl. .................... 505/706; 505/700; 505/887; 505/884; 505/825; 505/220; 505/460; 505/100; 505/124; 252/503; 423/445 B; 423/DIG. 39; 423/DIG. 40; 174/125.1
[58] Field of Search .................... 252/502, 503, 252/500, 512; 423/445 B, DIG. 39, DIG. 40; 257/613, 798; 505/100, 124, 785, 810, 801, 460, 706, 700, 887, 884, 825, 220; 174/125.1

[56] References Cited

U.S. PATENT DOCUMENTS

| | | | |
|---|---|---|---|
| 4,249,013 | 2/1981 | Haddon et al. | 549/35 |
| 4,673,589 | 6/1987 | Standley | 427/41 |
| 5,035,835 | 7/1991 | Asakawa et al. | 252/500 |
| 5,196,396 | 3/1993 | Lieber | 505/811 X |
| 5,223,479 | 6/1993 | McCauley et al. | 505/810 X |
| 5,294,600 | 3/1994 | Tanigaki et al. | 252/500 X |
| 5,324,495 | 6/1994 | Gorun | 252/500 X |
| 5,380,595 | 1/1995 | Ueba et al. | 423/445 B X |
| 5,391,323 | 2/1995 | Haddon et al. | 505/100 X |

OTHER PUBLICATIONS

Murphy, D.W., et al., "Superconductivity in Alkali Metal Fullerides", *Physica C*, 185–189 (1 Dec. 1991) 403–408.
Pauling, Linus, "The structure of $K_3C_{60}$ and the mechanism of superconductivity", *Proc. Natl. Acad. Sci. USA*, 88 (Oct. 1991), 9208–9209.
Zakhidov, A. A., et al., *Solid State Communications*, 79 (11) (Sep. 1991) 939–46.
Kelty, Stephen P., et al., *Nature*, 352 (18 Jul. 1991), 223–4.
Chen, Chia–Chun, et al., *Science*, 253 (23 Aug. 1991), 887–8.
Holczer, Károly, et al., *Science*, 252 (24 May 1991), 1154–7.
Wang, H. Hau, et al., *Inorg. Chem.*, 30 (14) (Jul. 1991), 2838–9.
Wang, H. Hau, et al., *Inorg. Chem.*, 30 (15) (Sep. 1991), 2962–3.
Kroto, H.W., et al, *Nature*, 318, 162 14 Nov. (1985).
Kratschmer, W., et al, *Nature*, 347, 354 27 Sep. (1990).
Haddon, R.C., et al, *Nature*, 350, 46 7 Mar. (1991).
Haddon, R.C., et al, *Physical Review B*, 43, 2642 1 Feb. (1991).
Tycko, R., et al, *Science*, 253, 884–886 (Aug. 23, 1991).
Fleming, R.M., et al, *Nature*, 352, 701 (Aug. 22, 1991), 787 (Aug. 29, 1991).
Rosseinsky et al. "Superconductivity at 28K in $Rb_x C_{60}$" *Phys. Rev. Let* 66(21), 27 May 1991, pp. 2830–2832.
Stephens et al. "Structure of Single–Phase Superconducting $K_3C_{60}$" *Nature* vol. 351, 20 Jun. 1991, pp. 632–634.
Haddon et al. "Conducting film of $C_{60}$ and $C_{70}$ by Alkali–metal Doping" *Nature* 350, 28 Mar. 1991, pp. 320–322.
Hebard et al. "Superconductivity at 18K in Potassium–doped $C_{60}$" *Nature* vol. 350, 18 Apr. 1991, pp. 600–601.
McCauley et al. "Synthesis, Structure and Superconducting Properties of Single–Phase $Rb_3C_{60}$" *JACS* 113(22), 23 Oct. 1991, pp. 8537–8538.
Tanigaki et al. "Superconductivity at 33K in $Cs_xRb_yC_{60}$" *Nature* vol. 352, 18 Jul. 1991, pp. 222–223.

*Primary Examiner*—Douglas J. McGinty
*Attorney, Agent, or Firm*—Bruce S. Schneider; Scott J. Rittman

[57] ABSTRACT

Carbonaceous materials based on the fullerene molecules have been developed which allow for superconductivity. The fullerene materials are soluble in common solvents.

1 Claim, 3 Drawing Sheets

SUPERCONDUCTIVITY IN CARBONACEOUS COMPOUNDS AND DEVICES USING SUCH COMPOUNDS

CROSS-REFERENCE TO RELATED APPLICATION

This application is a continuation of application Ser. No. 07/818647, filed on Jan. 6, 1992, abandoned, which is a continuation-in-part of U.S. patent application Ser. No. 07/671,275 abandoned, filed Mar. 18, 1991, now abandoned, which is hereby incorporated by reference.

BACKGROUND OF THE INVENTION

1. Field of the Invention

This invention relates to superconducting compounds and, in particular, carbonaceous conductive compounds.

2. Art Background

Recently there has been significant interest in organic materials that are either conductive or that can be doped to produce conductivity. Such organic materials have been suggested for a wide variety of uses that depend on their conductivity. For example, organic materials are generally easily formed in thin fills as conductive components in devices such as switches, antistatic devices or magnetic shielding.

The classic carbon-based conductors are graphite and polyacetylene. (Graphite is characterized by an infinite sheet-like structure of the element carbon.) Graphitic materials typically have conductivities in the range $10^3$ to $10^5$ Siemens/cm, but are intractable and therefore for some applications do not lend themselves to fabrication of the desired devices. Polyacetylene when doped has conductivities as high as $10^4$ Siemens/cm, but can be processed only during its preparation. Other organic conductors, such as those based on tetrathiafulvalene, have high conductivities ($10^3$ Siemens/cm), but again are difficult to form into desired geometries. (See, for example, U.S. Pat. No. 4,249,013 dated Feb. 3, 1981.)

A class of nascent organic materials are those based on fullerenes. Such materials are prepared by an electronic discharge process as described in Kroto, H. W. et al., *Nature* 318, 162 (1985) and Kratschmer, W. et al., *Nature* 347, 354 (1990). These materials, as reported, are insulators. Attempts have been made to modify these materials to improve their conductivity. For example, as reported by Wudl, F. at the *Materials Research Society Meeting*, Nov. 29, 1990, Boston, Mass., a tetraphenylphosphonium salt of fullerene has been made, but exhibited a conductivity no greater than $10^{-5}$ Siemens/cm. No known reports of superconductivity in such materials have been reported before our invention thereof.

Thus, although a substantial body of research has been directed to tractable carbonaceous compounds having reasonable conductivities, such research has not been entirely successful.

SUMMARY OF THE INVENTION

Superconducting tractable materials have been made by electronic structure modification of fullerenes. In particular, compounds consisting essentially of carbon where essentially all the carbons are bound to three other carbons and where this carbon framework forms a finite polyhedron yield acceptable conductivities through, for example, the addition of electrons to the compound by doping. In one exemplary embodiment, a fullerene having 60 carbon atoms is deposited in a thin film and subjected to vapor phase alkali metals, e.g., lithium, sodium, potassium, rubidium or cesium. The resulting materials have conductivities in the range of 1 to 500 Siemens/cm at room temperature. It is possible to form the fullerene into desired shapes before doping either by solution or vapor phase deposition. The conductivity of these materials in the exemplary embodiments are sensitive to water vapor. When used in a conductive link, this loss of conductivity and concomitant decrease in current upon exposure to such water affords a sensor for water vapor.

BRIEF DESCRIPTION OF THE DRAWING(S)

DETAILED DESCRIPTION

Figure 1:
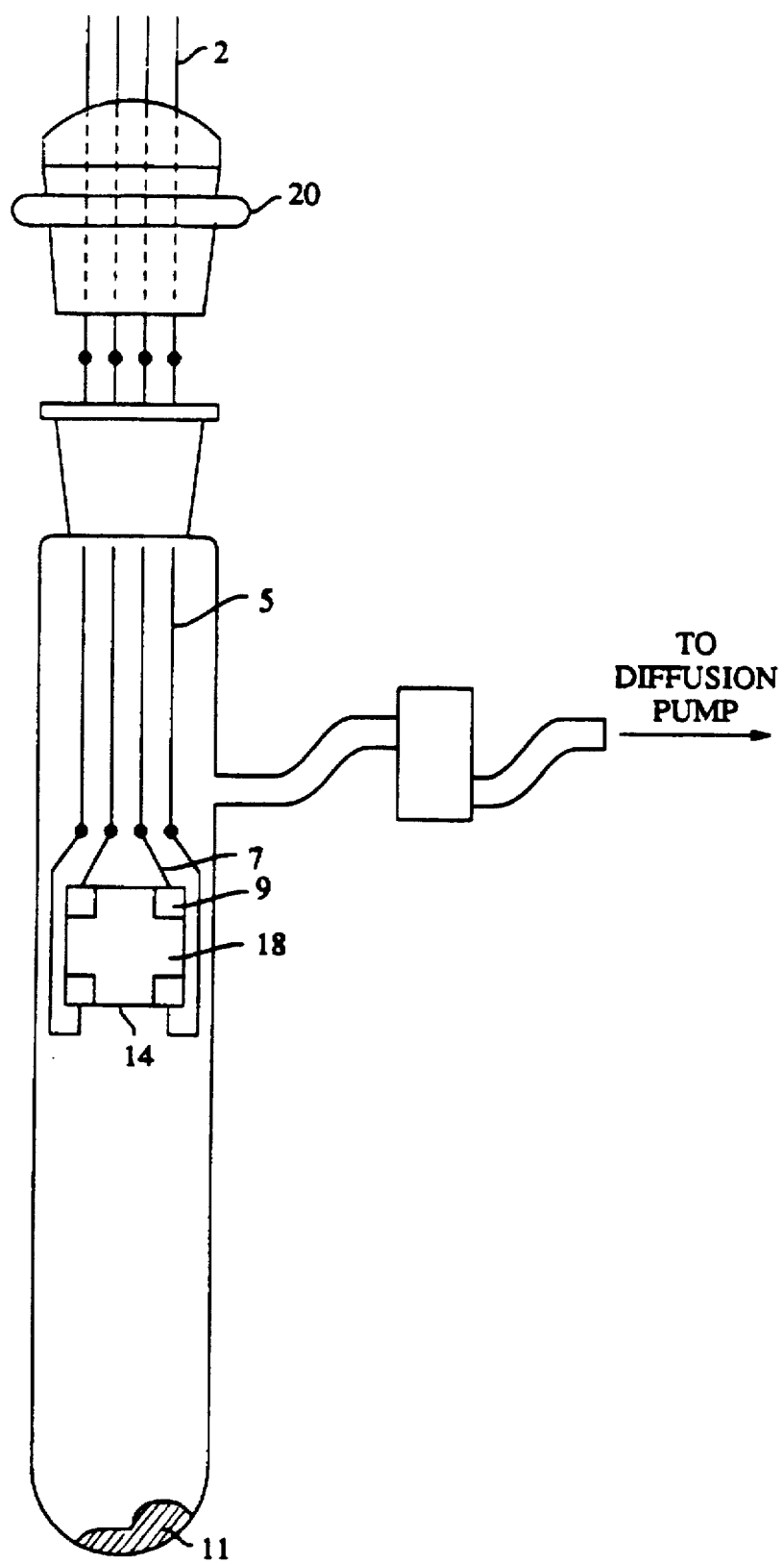
FIG. 1 is illustrative of an apparatus suitable for producing superconductive carbonaceous materials of the invention.
Figure 2:
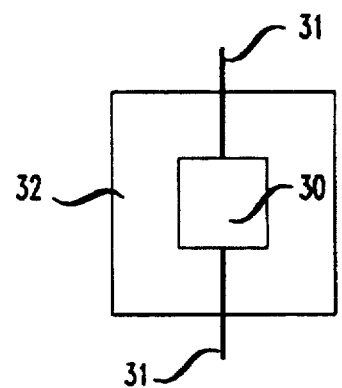
FIG. 2 is a schematic representation of a superconducting device representative of a class of devices according to this invention.
Figure 3:
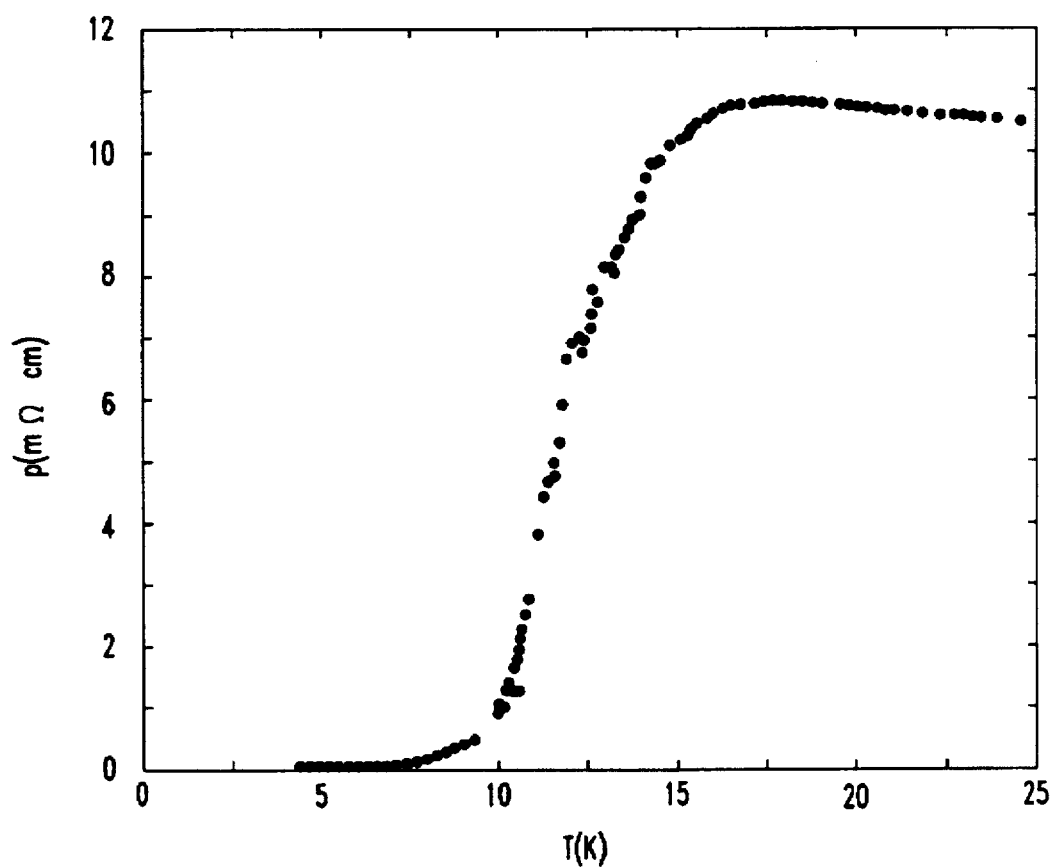
FIG. 3 is a plot of temperature dependence of the electrical resistivity of a 960 Å thick film of $K_xC_{60}$.

FIG. 2 is a schematic representation of a superconductor device including superconductor element 30, electrical leads 31 for passing a current through the superconductor body, and temperature control means indicated at 32 for maintaining the body of superconducting material below its critical temperature.

As discussed, the invention involves superconductive fullerenes. These fullerenes are molecular compounds characterized by 1) a network including essentially only carbon atoms, 2) where essentially all these carbons are bound to only three other carbons, and 3) where these carbons are spatially distributed in the molecule so that each carbon constitutes a vertex of a finite polyhedron. The invention also includes fullerenes, as defined above, where no more than 10% of the carbon atoms are modified by 1) addition of a substituent, 2) replacement with a different atom other than carbon, or 3) absence from the carbon skeleton.

In an exemplary embodiment these fullerenes, as defined above, are made superconductive by addition or removal of electrons, i.e., by electronic modulation. In one embodiment, electrons are added to the fullerene structure by charge transfer from a species more electropositive than the fullerene. For example, it is possible to electronically modulate a fullerene by subjecting it to an alkali metal vapor. Alkali metals, such as sodium, potassium, rubidium and cesium, are significantly more electropositive than fullerene and therefore donate electrons to the fullerene structure. It is believed that the alkali metal is spatially located outside the fullerene carbon net and electronically interacts from that position. However, electron modulation by spatial location within the fullerene polyhedron, by coordination, or by direct chemical bonding is not precluded.

The conductivity of the fullerene depends on the amount of electronic modulator present. For example, with C 60, as electronic modulator is introduced the material becomes more and more conductive until conductivities of 10, 20, 500, 100, and 4 Siemens/cm, respectively, for lithium, sodium, potassium, rubidium and cesium electronic modulators, are reached. Addition of further electronic modulator leads to a decrease in conductivity. A contemplated explanation for this behavior is that initial introduction of electronic modulator partially fills the conduction band of the fullerene leading to higher conductivity. However, as greater concentrations of electronic modulator are introduced, the conduction band becomes full and electron conductivity is precluded. Although not all fullerenes necessarily behave in this manner, a suitable concentration for an electron modulator to yield a conductive material is easily determined using a series of controlled samples. Exemplary of concentrations useful to produce a conductive material in fullerenes are use of alkali materials having a modulator to $C_{60}$ mole ratio in the range 1 to 20%. Use of relatively large electronic modulators such as cesium, although not precluded, is not preferred. For example, thin films of $C_{60}$ exhibit spalling on modulation with cesium.

For some materials, such as $C_{60}$, the presence of an alkali metal electron modulator not only produces conductivity but produces a sensitivity of this conductivity to water. Introduction of water generally reduces the conductivity. Thus, such materials are useful as detectors for the presence of water vapor. A current is introduced through the conducting fullerene and the current flow noted. A decrease in current flow indicates an increasing presence of water vapor.

The following examples are illustrative of embodiments of the invention.

EXAMPLE 1

Approximately 10 mg of $C_{60}$ fullerene, produced as described by Kratschmer, *Nature*, 347, 354 (1990) and then purified by column chromatography as described by Haddon, *Nature*, 350, 46 (1991), was placed in an alumina crucible. The crucible environment was evacuated to a pressure of approximately $1.5 \times 10^6$ Torr and the material was heated to a temperature of approximately 300° C. The use of a 300° C. sublimation produced a $C_{60}$ film. Under these conditions evaporation onto a glass slide was induced at a deposition rate of approximately 40 Å/min. The deposition was continued until a thickness of approximately 100–1000 Å was achieved. (Before deposition, the glass slide was coated with strips of evaporation deposited silver metal having a depth of approximately 1,000 Å and a spacing of approximately 1 cm.) Five millimeter diameter silver wires were attached to the silver strips with silver epoxy and cured at 200° C. for one hour.

EXAMPLE 2

The procedure of Example 1 was followed, except $C_{70}$, prepared in accordance with Kratschmer supra and Haddon supra, was evaporated onto the silver coated glass slide at a temperature of approximately 400° C. to produce a $C_{70}$ film.

EXAMPLE 3

The fullerene coated slide prepared as in Example 1 with a thickness of 810 Å was placed at 14 in the apparatus represented in the Figure. (The films before further processing had a conductivity of less than $10^{-5}$ Siemens/cm.) Approximately 1 g of cesium metal was loaded at 11 into the apparatus in a dry box. The apparatus was then evacuated to a pressure measured at the pump of approximately $10^{-5}$ Torr.

The apparatus was immersed in an oil bath and the temperature of this oil bath was raised at a rate of approximately 5° C./hr. until 40° C. was reached. This temperature was maintained for approximately 1 hour. After this time period, the conductivity as measured at room temperature by probes 9 (silver strips) connected through leads 7, 5 and 2 through the apparatus and cap 20 was approximately $2 \times 10^{-4}$ Siemens/cm. Continued heating caused the conductivity to increase to a maximum of 4 Siemens/cm after an additional 90 minutes and then decline after a further hour to approximately 0.06 Siemens/cm.

EXAMPLE 4

A fullerene film of 388 Å thickness was prepared by the procedure of Example 1, modulated as in Example 3, except with rubidium metal and loaded into the apparatus. A load of 1 g and a bath temperature of 120° C. led to an observed conductivity maximum of 100 Siemens/cm and a subsequent decrease to less than $10^{-5}$ Siemens/cm after 2 hours heating.

EXAMPLE 5

The procedure of Example 4 was followed except the film thickness was 840 Å and 1 g of sodium metal was used at a bath temperature of 180° C. leading to a maximum conductivity of 20 Siemens/cm. After a further three hours, the conductivity fell to 0.4 Siemens/cm.

EXAMPLE 6

The procedure of Example 4 was followed except the film thickness was 840 Å and 1 g of potassium metal was used at a bath temperature of 130° C. leading to a maximum conductivity of 500 Siemens/cm. After a further four hours, the conductivity decreased to less than $10^{-5}$ Siemens/cm.

EXAMPLE 7

A fullerene film prepared by the procedure of Example 2 (150 Å film thickness) and modulated as in Example 3 was employed, except 1 g of potassium metal was loaded into the apparatus. After one hour at 120° C. the conductivity reached 2 Siemens/era and after two further hours fell to 0.02 Siemens/cm.

EXAMPLE 8

The product of Example 5 was exposed to the atmosphere and its conductivity fell from 5 Siemens/cm to less than $10^{-5}$ Siemens/cm within 30 seconds.

EXAMPLE 9

Solid $C_{60}$ (0.5 mg) was placed in a sealed quartz capillary of diameter 1 mm and length 2 cm, and this was loaded into a 4 mm diameter ESR tube with a ⅛' glass termination. The sample tube was then transferred to a dry box. On top of the fullerene containing tube, in the ESR tube was then placed an open-ended capillary of diameter 1 mm, length 2 cm, containing 1 cm of solid potassium. The ESR tube was then connected to an Ultra-Torr® fitting, with vacuum stopcock and o-ring termination. The closed apparatus was removed from the dry box, connected to a vacuum line and evacuated to $1 \times 10^{-3}$ Torr, and the ESR tube sealed with a torch, to give an ESR tube of length 24 cm. The whole tube was placed in an oven and subjected to a series of heat treatments up to 220° C. over a two day period, and then placed in a gradient tube furnace for 16 hours with the potassium capillary at 240° C. A darkened portion of the tube, away from the $C_{60}$, was heated with a torch over 5 minutes. After a few days a microwave-loss technique (Haddon, *Phys. Rev. B'* 43, 2642 (1991)), showed an absorption consistent with the onset of superconductivity at 18K.

EXAMPLE 10

The procedure of Example 1 was followed, except 1 g of lithium metal was used, contained in a Kovar piece sealed to the Pyrex apparatus shown in the Figure, and the film thickness was 810 Å. The Kovar metal containing the lithium was warmed gently with a flame, producing an increase in conductivity within a minute, the conductivity rising to 10 Siemens/cm after four minutes then falling to less than 1 Siemens/cm after five minutes further heating.

EXAMPLE 11

29.5 mg of $C_{60}$ prepared according to Kratschmer, supra, purified according to Haddon et al supra, and dried at 160° C./5×10$^{-6}$ Torr for 12 hours, were loaded into a 4 mm (5 cm long) outer diameter high purity quartz tube, in turn sealed to a ⅜' quartz tube (12 cm long). Approximately 16.33 mg cesium, contained in 5.24 cm of 0.457 mm internal diameter capillary tubing, was loaded in a dry box into the ⅜' quartz part of the apparatus to give a stoichiometry $Cs_3 C_{60}$. The entire apparatus was evacuated to 8×10$^{-6}$ Torr, backfilled with 10$^{-2}$ Torr helium gas then sealed 4 cm from the top of the ⅜' section. The cesium was gently distilled out of the capillary first using a flame, then by placing the cesium containing ⅜' section at 300° C. in a furnace with the $C_{60}$ containing 4 mm section at room temperature, for forty-eight hours. During this period, the cesium distilled into the narrow 4 mm section, reacting with the $C_{60}$ to produce a two-color (black on top, khaki on bottom) mixture. The tube was then sealed to produce a 5 cm long ⅜' section containing the reacted $C_{60}$ and remaining cesium: this tube was heated at 60° C. in a water bath for 24 hours. The magnetic susceptibility measured by the Faraday technique with a 14 KGauss field was temperature independent between 300° K. and 20° K., rising slightly below 20° K. then decreasing sharply below 12° K., consistent with metallic behavior down to 12° K. and the onset of superconductivity below this temperature.

EXAMPLE 12

This describes the preparation of $A_3 C_{60}$ where A is K, Rb, Cs or a mixture of these. The weight of $C_{60}$ and alkali metal used together with the reaction conditions are given in Table I. The $C_{60}$ is placed in a 5 mm outer diameter Pyrex tube which is sealed to a 9 mm outer diameter Pyrex tube. Capillary tubing of precise internal diameter (0.457 mm to 1.016 mm) is filled with alkali metal and cut to the correct length in a dry box to give the weight of alkali metal shown in Table I. This length of tubing is placed in the 9 mm section of the Pyrex tube. The tube is then connected to a stopcock, evacuated to ~2×10$^{-5}$ Torr and sealed with a blowtorch. The tube is then heated as described under 'Reaction Conditions' in Table I. During this procedure the 5 mm end of the tube containing the $A_3 C_{60}$ product is sealed off when visual examination indicates all the alkali metal has reacted. After the heating procedure has been completed, the temperature dependence of the magnetization is measured in a SQUID magnetometer by cooling in zero field to 4K then taking data on warming, followed by field cooling to 4K (a 10 Gauss field is used). A portion of the sample is transferred in a dry box into an x-ray capillary tube then sealed and the powder x-ray diffraction pattern recorded, allowing evaluation of the lattice parameter of the face-centered cubic crystal structure. In each $A_3 C_{60}$ material described in Table I, the zero-field cooled magnetization is negative below the superconducting critical temperature $T_c$, and its magnitude at 4K allows calculation of the fraction of perfect diamagnetism ($-¼\pi$), referred to as the volume fraction. The observation of the Meissner effect (field cooled magnetization negative but smaller in magnitude than the zero field cooled magnetization) confirms superconductivity in these samples.

EXAMPLE 13

$K_{1.5} C_{60}$ (32.4 mg $C_{60}$, 2.6 mg K, 210° for 5 days, 255° for 7 days, 270° for 5 days) and $K_2C_{60}$ (30.5 mg $C_{60}$, 3.3 mg K, 210° for 3 days, 250° for 7 days, 300° for 13 days) are prepared using the techniques indicated in Example 1. $^{13}$C nuclear magnetic resonance spectroscopy shows that these $K_xC_{60}$ compositions (0<x<3) are mixtures of $C_{60}$ and $K_3C_{60}$, i.e., $K_{1.5}C_{60}$ is in fact $0.5C_{60}+0.5 K_3C_{60}$, as shown by the observation of two lines of equal integrated intensity at 143 ppm ($C_{60}$) and 186 ppm ($K_3C_{60}$).

EXAMPLE 14

This describes the preparation of $K_3C_{60}$ using $KBH_4$ as a reducing agent. 30 mg $C_{60}$ and 6.7 mg $KBH_4$ are weighed out in a dry box, ground together with an agate mortar and pestle and then placed in a 7 mm outer diameter Pyrex tube. The tube is evacuated to 2×10$^5$ and sealed with a blowtorch. The tube is heated to 275° from room temperature over a period of 16 hours, held at 275° for four hours and then the temperature raised to 350° over four hours. The sample is heated at 350° for five days. Magnetization measurements in a SQUID magnetometer show The sample to be superconducting with $T_c$=19.3K, 10–50% transition width =1.25K, and 25% shielding fraction. Powder x-ray diffraction showed the sample was phase-pure $K_3C_{60}$.

EXAMPLE 15

A bulk polycrystalline sample of nominal composition $K_3C_{60}$ was prepared by reaction of 29.5 mg of $C_{60}$ with a 4.8 mg potassium. The amount of potassium was controlled volumetrically by using potassium-filled pyrex capillary tubing cut to size in a dry box. The reaction was run with the $C_{60}$ in a 5-mm fused silica tube joined to a larger tube in which the potassium-containing capillary was placed. The tube was sealed after being evacuated and refilled with 10$^{-2}$ Torr of helium to serve later as a thermal-exchange gas for low-temperature measurements. With the $C_{60}$-containing end of the tube at room temperature, the potassium was distilled from the capillary in a furnace at 200° C. Some reaction of the potassium with the quartz tube, visible as a dark brown discoloration, was observed after this period. Following distillation of the potassium to the $C_{60}$ end, the tube was shortened by sealing to about 8 cm and heated to 200° C. for 36 h. Finally, the tube was reseated to a length of about 4 cm for magnetic measurements.

The temperature dependence of the d.c. magnetization of the sample with nominal composition $K_3C_{60}$ was measured in a SQUID magnetometer. On zero-field cooling the sample to 2K, a magnetic field of 50 Oe was applied. On warming, this field is excluded by the sample to K; this verifies the presence of a superconducting phase. The bulk nature of superconductivity in the sample is demonstrated unambiguously by cooling in a field of 50 Oe. A well defined Meissner effect (flux expulsion) develops below 18K. The shape of the magnetization curve, in particular the temperature-independent signal at low temperature, indicates good superconducting properties for this sample. Also noteworthy is the relatively narrow transition width. The magnitude of the flux exclusion for the zero-field-cooled curve corresponds to 1% volume fraction. This small fraction is possibly due to non-optimal doping or the granular nature of the sample. The large value of the Meissner effect for the field-cooled curve relative to the total exclusion, however, indicates bulk superconductivity in the electrically connected regions.

TABLE I

| Composition | Weight of $C_{60}$ (mg) | Alkali metal | Reaction conditions | $T_c$ (K) | Volume fraction (1%) | Lattice parameter (Å) |
|---|---|---|---|---|---|---|
| $Rb_2CsC_{60}$ | 28.2 | 6.69 mg Rb<br>5.2 mg Cs | 16 days at 210°: 5 days at 255°<br>18 days at 270°: 3 days at 400° | 31.3 | 48 | 14.493 (2) |
| $Rb_3C_{60}$ | 30.3 | 10.8 mg Rb | 10 days at 200°: 6 days at 255°<br>3 days at 400°: press pellet:<br>6 days at 400° | 29.4 | 55 | 14.436 (2) |
| $Rb_2KC_{60}$#2 | 31.7 | 1.7 mg K<br>7.5 mg Rb | 4 days at 230°: 5 days at 255°<br>13 days at 270°: 14 days at 350°:<br>400° 1 day | 26.40 | 32 | 14.364 (5) |
| $Rb_2KC_{60}$#1 | 29.5 | 1.6 mg K<br>6.9 mg Rb | 16 days at 255°: 2 days at 270°:<br>7 days at 400° | 24.40 | 33.5 | 14.336 (1) |
| $Rb_{1.5}K_{1.5}C_{60}$ | 31.6 | 2.6 mg K<br>5.6 mg Rb | 4 days at 230°: 5 days at 255°:<br>14 days at 270°: 14 days at 350°:<br>1 day at 400° | 25.1 | 19.0 | 14.341 (1) |
| $RbK_2C_{60}$ | 34.9 | 4.1 mg Rb<br>3.8 mg K | 6 days at 230°: 5 days at 255°:<br>13 days at 270°: 4 days at 400° | 21.8 | 22.0 | 14.299 (2) |
| $K_3C_{60}$ | 30.8 | 5 mg K | 4 days at 200°: 1 day at 245°:<br>6 days at 255°: 10 days at 270° | 19.3 | 29 | 14.253 (3) |
| *$Rb_{1.5}Cs_{1.5}C_{60}$ | 43.9 | 7.8 mg Rb<br>12.2 mg Cs | 12 days at 225°<br>5 days at 400° | 32.5 | <5 | 14.506 (5) |
| *$Na_2Cs$ | 25.1 | 10 mg $Cs_{6.6}C_{60}$<br>8.5 mg $Na_2Hg_2$ | 1 day at 250°<br>2 days at 350° | 10.5 | 10 | 14.132 (2) |

*All materials except those marked with asterisks were single phase to x-ray powder diffraction. The fcc lattice constant is given for the multiphase samples.

Figure 4:
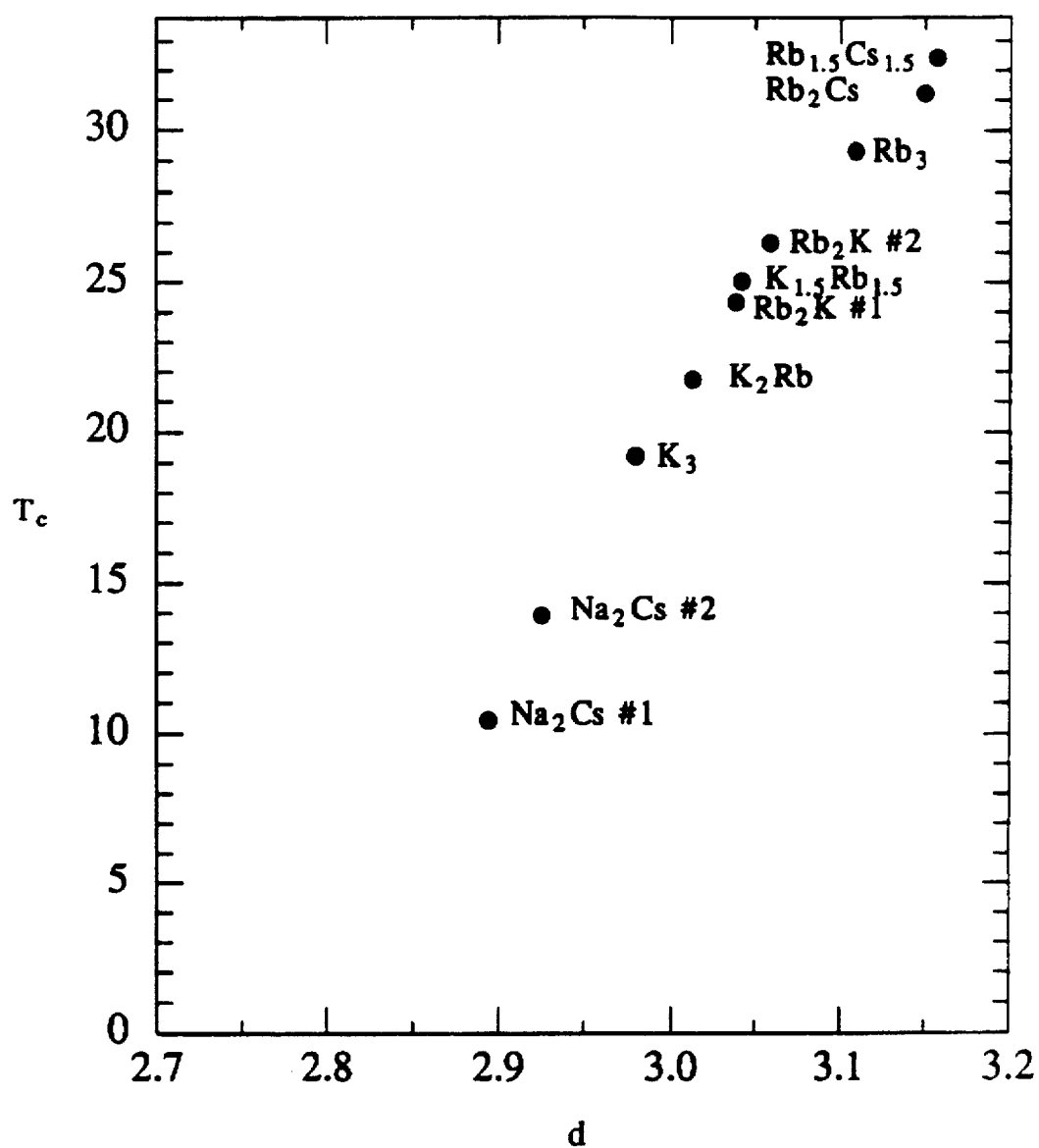
FIG. 4 is a plot of superconducting transition temperature $T_c$ in degrees Kelvin vs. lattice parameter d, the nearest neighbor atomic spacing, for a series of superconducting composition according to the invention.

Conductivity measurements were performed on typical samples of potassium-doped films of $C_{60}$ that were prepared in a one-piece all-glass version of the apparatus described previously. This reaction vessel was sealed under a partial pressure of helium before reaction. This configuration allowed both in situ doping and low-temperature studies of thin films. All measurements were made in a four-terminal Van der Pauw configuration using a 3 μA a.c. current at 17 Hz. FIG. 4 shows the temperature dependence of the resistivity of 960 Å-thick  $C_{60}$ film. The film was doped with potassium until the resistivity had fallen to $5 \times 10^{-3}$ Ω cm. The resistivity increases by a factor of two on cooling the sample to near 20K. Below 16K, the resistivity starts to decrease; zero resistivity ($<10^{-4}$ of the normal state) is obtained below 5K. The 10–90% width of the transition is 4.6K. At 4K we measured the lower bound to the critical current to be 40 A cm$^{-2}$ The superconducting fullerenes can be characterized by the general formula:

$$A_x C_{60}$$

where A is selected from the group consisting of K, Cs, Rb, and mixtures thereof, and mixtures of Na, Li, K, Cs, Rb (sodium and lithium alone have not been found effective), and x=3.0 ±10%.

The superconducting materials are further characterized by a face centered cubic lattice with a closest approach between atoms of nearest neighbor molecules in the range of 2.8 to 3.3 Å. The closest approach spacing d is calculated using the cubic lattice parameter, a, by:

$$d = \frac{a}{\sqrt{2}} - D$$

where D is the molecular diameter. FIG. 4 plots closest approach spacing d for several typical superconducting materials of the invention. It will be observed that the values of d fall in the range of 2.8 to 3.3 Å.

These descriptions are characteristic of a class of fullerene superconducting compositions based on alkali metal substitutions. Other substitutions will produce superconducting compositions also and investigations on these additional materials are continuing.

Various additional modifications and variations of the invention will occur readily to those skilled in the art. All those modifications that rely on the basic teachings of superconductivity in electronically modified fullerenes should be considered as within the spirit and scope of this invention.

We claim:

1. A superconducting device, comprising a body of superconducting fullerene material selected from the group consisting of $Cs_3C_{60}$, $K_3C_{60}$, and $Rb_3C_{60}$, leads attached to the material for passing an electric current throughout the material, and temperature control means for maintaining the material below its superconducting temperature.

* * * * *